United States Patent [19]

Masuoka et al.

[11] Patent Number: 4,667,266
[45] Date of Patent: May 19, 1987

[54] PRINTED-CIRCUIT BOARD WITH PROTECTION AGAINST STATIC DISCHARGE DAMAGE

[75] Inventors: Norio Masuoka; Nakayama Yasunobu, both of Tokyo, Japan

[73] Assignee: Kabushiki Kaisha Toshiba, Japan

[21] Appl. No.: 837,136

[22] Filed: Mar. 7, 1986

[30] Foreign Application Priority Data

Mar. 9, 1985 [JP] Japan .................................. 60-46886

[51] Int. Cl.⁴ .............................................. H05F 3/00
[52] U.S. Cl. .................................. 361/212; 361/399; 361/424
[58] Field of Search ............... 361/212, 220, 395, 399, 361/424

[56] References Cited

U.S. PATENT DOCUMENTS 4,456,800  6/1984  Holland .......................... 361/220 X Primary Examiner—Michael L. Gellner
Assistant Examiner—Brian W. Brown
Attorney, Agent, or Firm—Banner, Birch, McKie & Beckett

[57] ABSTRACT

A printed-circuit board, mounted inside the plastic housing of a piece of electrical equipment adjacent to a hole in the housing, has a ground trace adapted to be connected to a source of ground potential. The ground trace is positioned on the printed-circuit board so that, when the board is mounted in the housing, a portion of the ground trace is the nearest conductor to the hole. In this way, static discharges through the hole are prevented from damaging the equipment.

6 Claims, 5 Drawing Figures

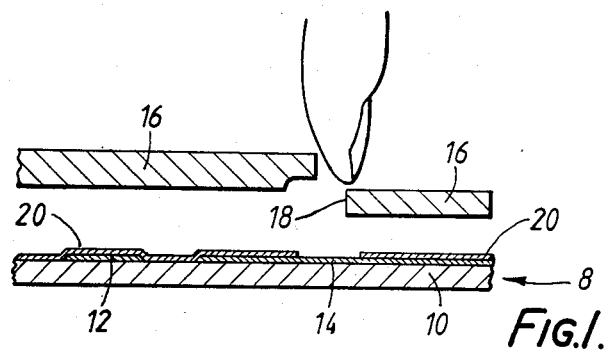
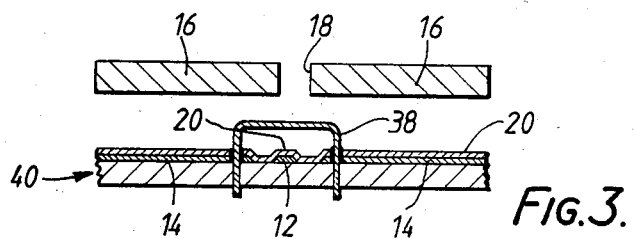
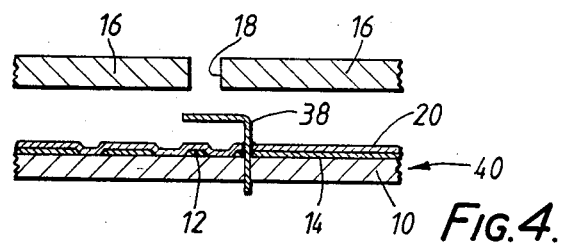
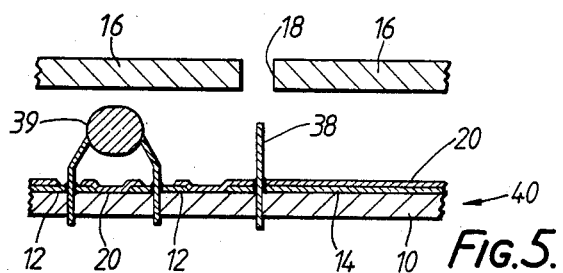

PRINTED-CIRCUIT BOARD WITH PROTECTION AGAINST STATIC DISCHARGE DAMAGE

BACKGROUND OF THE INVENTION

When the ambient relative humidity drops to 50% or below, the human body accumulates a large electrical charge. For example, when the relative humidity is 25%, a person walking across a carpet may acquire a potential of 10 kV or higher. If a person carrying such a charge comes into contact with, or passes very close to, an item of electrical equipment, such as a telephone or radio, the charge will be discharged to it. Most small electrical equipment have housings made of a dielectric material such as plastics; and the housings contain holes for various purposes, such as to expose switches. If a discharge occurs between a charged object and such a piece of equipment, it will occur to or from a conductive portion, such as a printed-circuit board within the housing, through one of the holes. A static discharge to one of the components or to the circuit trace of the printed-circuit board may cause erroneous operation of the equipment or even failure of one of the components.

A common remedial measure, at least in areas of the housing that have a high concentration of holes, is the insertion of a conductive sheet between the printed-circuit board and the housing. The conductive sheet, which has holes for the keys corresponding to the holes in the housing, is fastened, usually at one end, to a suitable ground. Since the conductive sheet is the closest of all of the conductors within the housing to the holes, static discharges through the holes terminate at the conductive sheet rather than at the printed circuit board.

Since the sheet has a comparatively large area so that it surrounds a large number of holes in the housing, it must be made very thin to save both weight and space. Consequently, it is apt to flex and to short parts of the circuit trace on the printed-circuit board. For this reason, an insulation pad is usually inserted between the conductive sheet and the printed-circuit board. The insulation pad sometimes has holes for the leads of keys to be extended to the printed-circuit board.

When *isolated* holes have to be formed in the housing of a piece of electrical equipment, several possibilities exist for preventing static discharge damage to printed-circuit boards mounted within the housing adjacent to the holes. First, a separate conductive sheet, similar to that used for concentrations of holes, may be grounded and inserted between the housing and the printed-circuit board. In this case, however, there is a difficulty in fabricating the separate conductive sheets so that they may be held in place within the housing. The other possibility is to use a single conductive sheet surrounding all of the holes in the housing. Although a single, large sheet may easily be fixed in place in the housing, it is wasteful of the small amount of available space.

SUMMARY OF THE INVENTION

One object of the present invention is to minimize the static discharge damage to printed-circuit boards and their attached components.

Another object is to minimize static discharge damage through isolated holes in the housing of a piece of electrical equipment, while avoiding the problems associated with the prior art.

To avoid static discharge damage through isolated holes in the housing of a piece of electrical equipment, the invention makes use of the printed-circuit board within the housing and eliminates the need either for separate conductive sheets for the isolated holes or for extending a single, large conductive sheet throughout the housing. The printed-circuit board includes a "ground trace" as part of the printed wiring. The ground trace is that portion of the printed wiring which is designed to be connected to a source of ground potential. The layout of the printed wiring is arranged so that the ground trace is the nearest conductor to each of the isolated holes through the housing when the printed-circuit board on which the ground trace is printed is mounted within the housing.

BRIEF DESCRIPTION OF THE DRAWINGS

FIG. 1 is a cross-sectional view, taken along line I-I of FIG. 2, of a printed-circuit board mounted within a housing adjacent to a hole in the housing.

FIG. 3 is a cross-sectional view of a printed-circuit board in a second embodiment of the invention.

FIG. 4 is a cross-sectional view of a printed-circuit board in a third embodiment of the invention.

FIG. 5 is a cross-sectional view of a printed-circuit board in a fourth embodiment of the invention.

DETAILED DESCRIPTION OF THE PREFERRED EMBODIMENT

Figure 2:
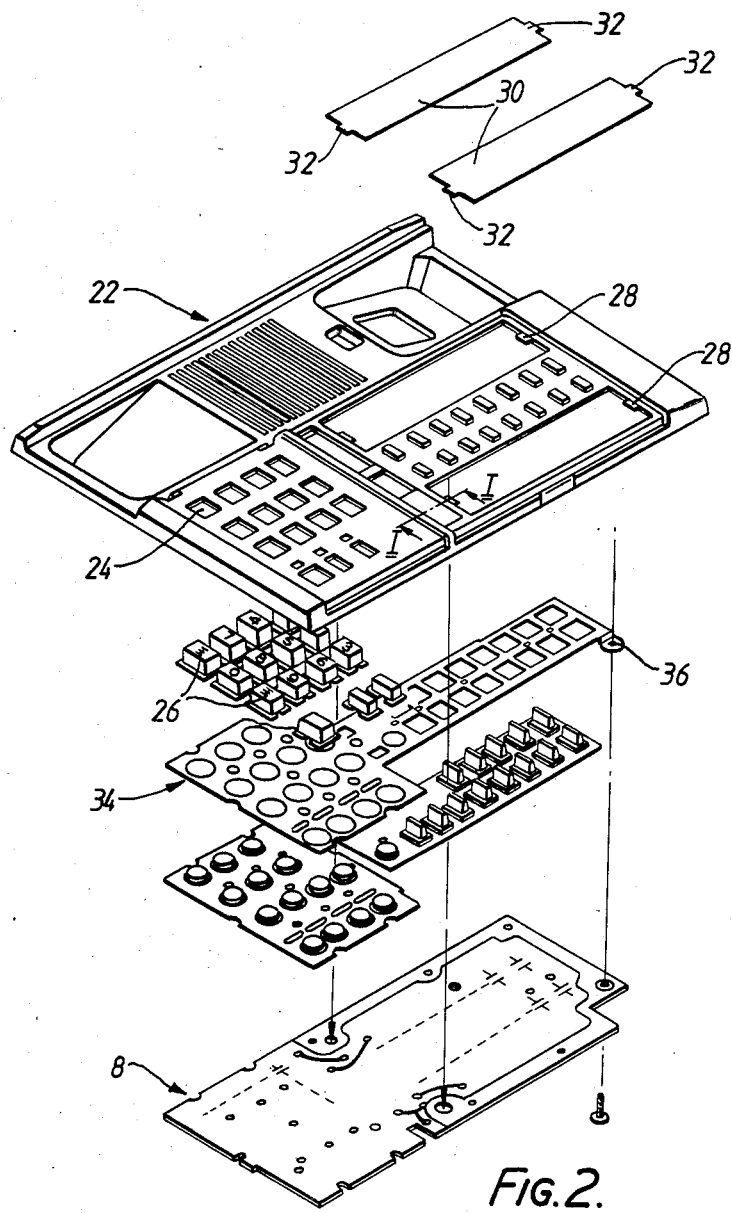
FIG. 2 is an exploded view of a portion of a telephone instrument including the printed-circuit board of FIG. 1.

FIG. 1 shows in cross-section a printed-circuit board 8 incorporating the invention. Dielectric substrate 10 serves as a support for the printed wiring, including circuit trace 12 and ground trace 14. Ground trace 14 is that portion of the printed wiring which is adapted to be connected to the source of ground potential. Circuit trace 12 is the remainder of the printed wiring on the printed-circuit board and is usually operated at potentials other than ground potential. The printed-circuit board 8 in FIG. 1 is mounted within housing 16 adjacent to hole 18. A finger is shown near hole 18 to illustrate the path of static discharge. The method of construction of printed-circuit boards, and the materials from which they are made, are well known and will not be discussed here.

As can be seen from FIG. 1, ground trace 14 is the nearest conductor to hole 18. In fact, if one were to look into the housing through hole 18, he would see a portion of ground trace 14 immediately in front of him. In other words, hole 18 and a portion of ground trace 14 are disposed face to face. To achieve this disposition, it is necessary to design the printed-circuit board with the location of hole 18 in mind.

The upper surface of the printed-circuit board may be coated with a material 20 that is resistant to solder. Certain areas of circuit trace 12 and ground trace 14, in such a case, are left uncoated. It is preferable that the portion of ground trace 14 which is face to face with hole 18 be left uncoated, although that is not necessary.

In this structure, when a highly charged body is brought near hole 18, it will discharge to the uncoated area of ground trace 14 and flow to a high capacitance circuit element such as a battery. The discharge will never occur to circuit trace 12; therefore, there will never be any damage to circuit elements connected to circuit trace 12.

The area of ground trace 14 left uncoated by solder resistant material 20 is left that way in order to facilitate static discharge to ground trace 14. However, as mentioned above, it is not necessary to reserve such uncoated areas. Even if the entire upper surface of the printed-circuit board were coated, static discharge would still occur to ground trace 14, as long as the coating is uniform.

FIG. 2 is an exploded view of a telephone instrument including a printed-circuit board incorporating the invention. The instrument has a plastic top cover 22 through which are formed a number of holes for various purposes. Holes 24, highly concentrated in a small area of top cover 22, allow for keys 26 to extend through the housing. Holes 38, which are isolated holes, are formed in the housing to enable label cover 30 to be fastened by tabs 32. Thin conductive sheet 34 is fastened to the printed-circuit board, and grounded, at tab 36 by a suitable fastener. Conductive sheet 34, as mentioned above, prevents static discharge through holes 24. However, sheet 34 does not extend to the area of holes 28. In these areas, ground trace 14 is positioned on substrate 10 so that a portion of ground trace 14 is the nearest conductor to each of holes 28.

FIGS. 3-5 illustrate, respectively, the second, third, and fourth embodiments of the invention. In each of these, printed-circuit board 8 has soldered to it a conductive element 38 (and, in the case of FIG. 5, capacitor 39), making it a printed-circuit assembly 40.

In FIG. 3, illustrating the second embodiment, conductive element 38 is an inverted-U-shaped metal wire or strip soldered at both ends to ground trace 14. Element 38 bridges the portion of circuit trace 12 lying immediately beneath hole 18. A separate conductive element 38 must be used in situations in which it is impossible to design printed-circuit board 8 so that a portion of ground trace 14 is closer to hole 18 than any portion of circuit trace 12.

In FIG. 4, conductive element 38 is an inverted-L-shaped metal wire or strip soldered at one end to ground trace 14 and overhanging the portion of circuit trace 12 lying immediately beneath hole 18.

In FIG. 5, conductive element 38 is a straight wire soldered to ground trace 14 at a point immediately beneath hole 18. Although, in this fourth embodiment, even without conductive element 38 ground trace 14 would be the closest conductor to hole 18, for additional protection, since capacitor 39 is so near hole 18, a conductive element is used.

Although illustrative embodiments of the present invention have been described in detail with reference to the accompanying drawings, it is to be understood that the invention is not limited to those precise embodiments, and that various changes and modifications may be effected therein by one skilled in the art without departing from the scope or spirit of the invention.

We claim:

1. A printed-circuit board for use in an item of electrical equipment contained in a housing having a hole, said printed-circuit board adapted to be mounted within the housing adjacent to the hole, said printed-circuit board comprising:
    a dielectric substrate; and
    printed wiring on said substrate, said printed wiring including a ground trace adapted to be connected to a source of ground potential and positioned on said substrate so that, when said printed-circuit board is mounted within the housing, a portion of said ground trace is the nearest conductor to the hole.

2. The printed-circuit board of claim 1 further comprising a solder-resistant coating covering at least part of said printed-circuit board, said portion of said ground trace being at least partly uncovered by said solder-resistant coating.

3. A printed-circuit assembly for use in an item of electrical equipment contained in a housing having a hole, said printed-circuit assembly adapted to be mounted within the housing adjacent to the hole, said printed-circuit assembly comprising:
    a dielectric substrate;
    printed wiring on said substrate, said printed wiring including a ground trace adapted to be connected to a source of ground potential; and
    a conductive element electrically connected to said ground trace and mounted on said substrate so that, when said printed-circuit assembly is mounted within the housing, said conductive element is the nearest conductor to the hole.

4. The printed-circuit assembly of claim 3 wherein said conductive element is a straight metal piece.

5. The printed-circuit assembly of claim 3 wherein said conductive element is a U-shaped metal piece mounted at both ends on said substrate to bridge an ungrounded portion of said assembly.

6. The printed-circuit assembly of claim 3 wherein said conductive element is an L-shaped metal piece mounted at one end on said substrate to overhang an ungrounded portion of said assembly.

* * * * *